United States Patent
Wu

[11] Patent Number: 5,849,617
[45] Date of Patent: Dec. 15, 1998

[54] METHOD FOR FABRICATING A NESTED CAPACITOR

[75] Inventor: Shye-Lin Wu, Hsinchu Hsien, Taiwan

[73] Assignee: Powerchip Semiconductor Corp., Hsin-Chu, Taiwan

[21] Appl. No.: 881,753

[22] Filed: Jun. 24, 1997

[51] Int. Cl.⁶ .................................................. H01L 21/8242
[52] U.S. Cl. ........................... 438/253; 438/254; 438/397
[58] Field of Search ..................................... 438/238–239, 438/253–254, 381–382, 396–397

[56] References Cited

U.S. PATENT DOCUMENTS

5,438,011  8/1995  Blalock et al. ............................ 437/52
5,453,633  9/1995  Yun ........................................ 257/306

Primary Examiner—Joni Chang
Attorney, Agent, or Firm—Ladas & Parry

[57] ABSTRACT

A method for fabricating a capacitor on a semiconductor substrate is disclosed. The method includes forming a first TEOS layer, a polysilicon layer and a second TEOS layer over the semiconductor substrate. A window is formed through the second TEOS layer to expose a portion of the polysilicon surface. Defined by a first dielectric spacer in the window, the polysilicon layer is etched to expose a portion of the first TEOS layer. The second TEOS layer and the exposed portion of the first TEOS layer are then removed to form a trench extending down to the semiconductor substrate. A polysilicon plug is filled in the trench and a first polysilicon spacer is formed around the first dielectric spacer. A lower electrode including the polysilicon plug, the polysilicon layer and the first polysilicon spacer is therefore formed by removing the first dielectric spacer. Moreover, a dielectric layer and an upper electrode are formed over the lower electrode.

21 Claims, 8 Drawing Sheets

METHOD FOR FABRICATING A NESTED CAPACITOR

BACKGROUND OF THE INVENTION

1. Field of the Invention

The present invention relates to a method for fabricating a semiconductor integrated circuit, and more specifically, to a method for fabricating a highly-integrated nested capacitor use in the memory cells of high density Dynamic Random Access Memory (DRAM).

2. Description of Related Art

The basic elements of a DRAM cell include, in general, a transistor and a capacitor. Since the DRAM cell stores a 1-bit of data by means of the capacitor, the charge capacity of the capacitor is an important determinant in the performance of the DRAM cells. In order to improve the performance of the DRAM cell, the dimensions of the capacitor are preferably increased. However, increasing the dimensions of the capacitors used in DRAM cells reduces the density of the whole DRAM device. A highly integrated capacitor structure is therefore desired to improve performance as well as to allow a high density device to be fabricated.

Figure 1A:
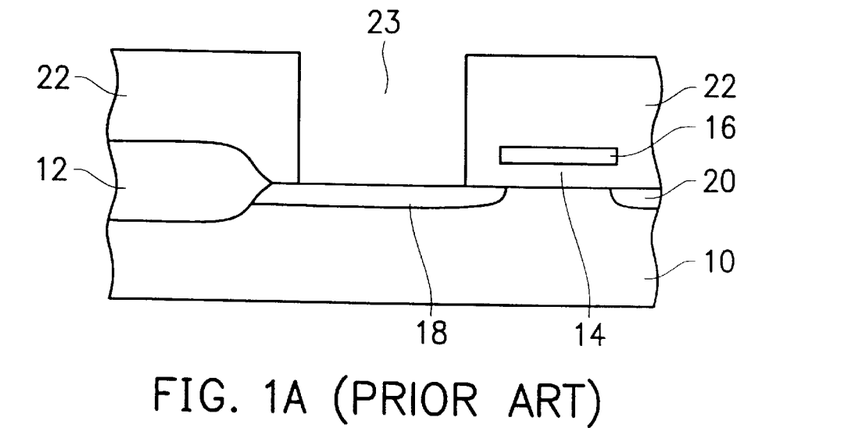
FIG. 1A through FIG. 1E are cross-sectional views illustrating the fabrication steps of a conventional stacked capacitor.

FIG. 1A through FIG. 1E illustrate the fabrication steps of a conventional DRAM memory cell and particularly the capacitor thereof. Referring to FIG. 1A, a transistor having a gate oxide layer 14, a gate electrode 16 and diffusion regions 18 and 20 are formed over a silicon substrate 10. The transistor is isolated from other devices by a field oxide layer 12. In order to fabricate a capacitor, an insulation layer 22, in which a window 23 over the diffusion region 18 is defined, is formed over the transistor and the field oxide 12. Therefore, a portion of the diffusion region 18 is exposed in the window 23.

Figure 1B:
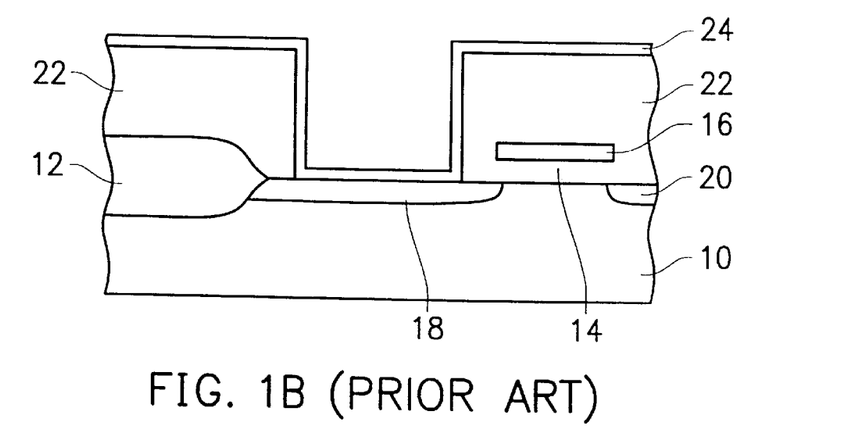
Figure 1C:
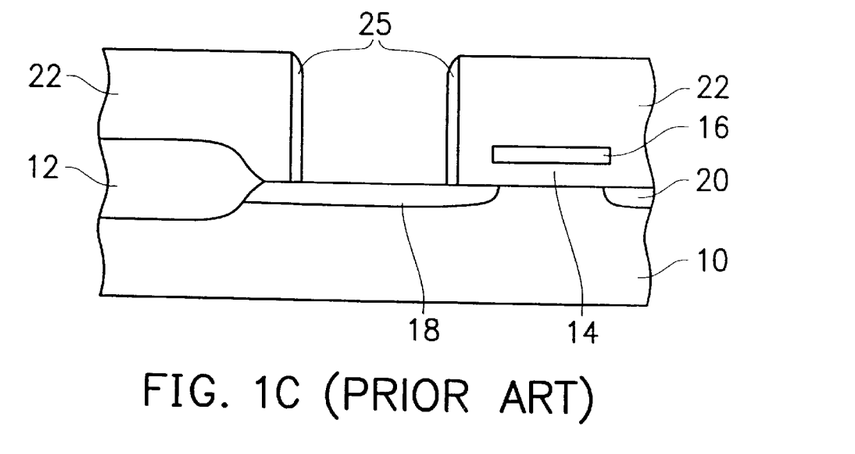

Referring to FIG. 1B, a nitride layer 24 is deposited over the structure of FIG. 1A, thereby covering the inner surfaces of the window 23. The nitride layer 24 is then etched back, as shown in FIG. 1C, to leave a sidewall spacer 25 in the window 23, leaving the upper surface of the insulation layer 22 and the lower surface of the window 23 uncovered.

Figure 1D:
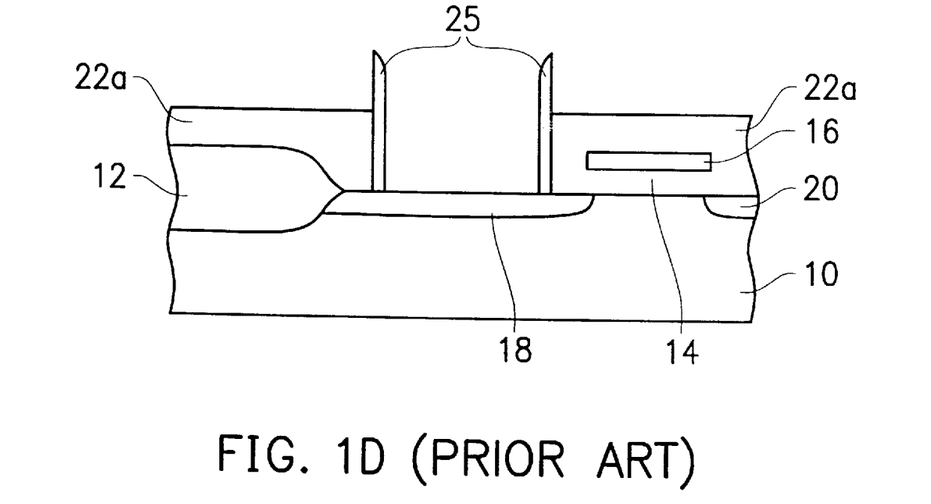
Figure 1E:
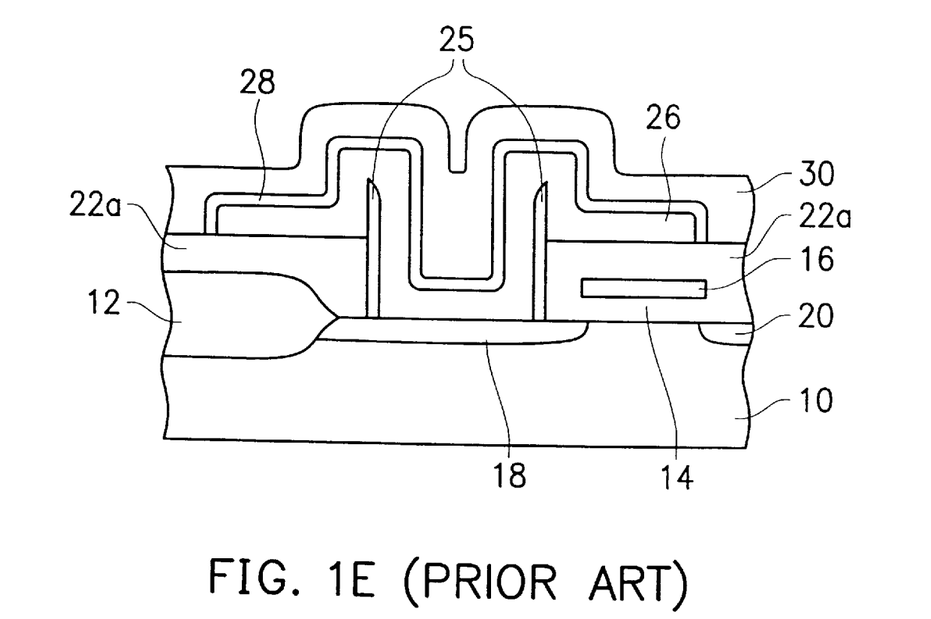

Referring to FIG. 1D, the insulation layer 22 is partially etched back, thereby allowing a portion of the spacer 25 to project beyond the new level of insulation layer 22a. A first polysilicon layer 26 is then deposited over the structure of FIG. 1D to contact the diffusion region 18, as shown in FIG. 1E. The area of the polysilicon layer 26 is patterned according to the desired limits of the DRAM cell's dimensions, the first polysilicon layer 26 thereby defining a lower electrode of the DRAM cell's capacitor. The first polysilicon layer 26 is then successively covered by a dielectric layer 28 and a second polysilicon layer 30, thus forming a complete capacitor.

As compared with other conventional stacked capacitors, the capacitor fabricated by the aforementioned method has a larger lower electrode due to the extension of the spacer 25 from the surface of insulation layer 22a. However, the integrity of the capacitor does not high enough for the high-density DRAMs. Moreover, the width of the window 23 must be larger than the total thickness of the layers filled therein (i.e., the sidewall spacer 25, the polysilicon layer 26 and the dielectric layer 28). Since each of the layers filled in the window 23 must have a minimal thickness, the width of the window 23 is limited to a critical value which depends on the fabrication techniques. Therefore, the method suffers process limitations.

SUMMARY OF THE INVENTION

Accordingly, the invention provides a method for fabricating a highly-integrated nested capacitor without suffering the process limitations alluded to above.

The capacitor of the present invention is fabricated on a semiconductor substrate. The method of the invention includes the steps of forming a first TEOS layer over the semiconductor substrate; forming a polysilicon layer over the first TEOS layer; forming a second TEOS layer over the polysilicon layer; removing a portion of the second TEOS layer to form a window thereon, thereby exposing a portion of the polysilicon surface; forming a first dielectric spacer in the window; removing the exposed portion of the polysilicon layer in the window, thereby exposing a portion of the first TEOS layer; removing the second TEOS layer and the exposed portion of the first TEOS layer, thereby forming a trench reducing down to the semiconductor substrate; depositing a polysilicon layer to fill the trench and to form a first polysilicon spacer around the first dielectric spacer; and removing the first dielectric spacer.

In a preferred embodiment of the invention, a plurality of dielectric spacers and a plurality of polysilicon spacers can be successively formed around the first polysilicon spacer, and then the first dielectric spacer and the plurality of dielectric spacers are removed, thereby forming a multi-spacer lower electrode. Therefore, the capacitance of the nested capacitor is significantly increased, and the performance of the DRAM device is improved.

DETAILED DESCRIPTION OF THE INVENTION

Figure 2A:
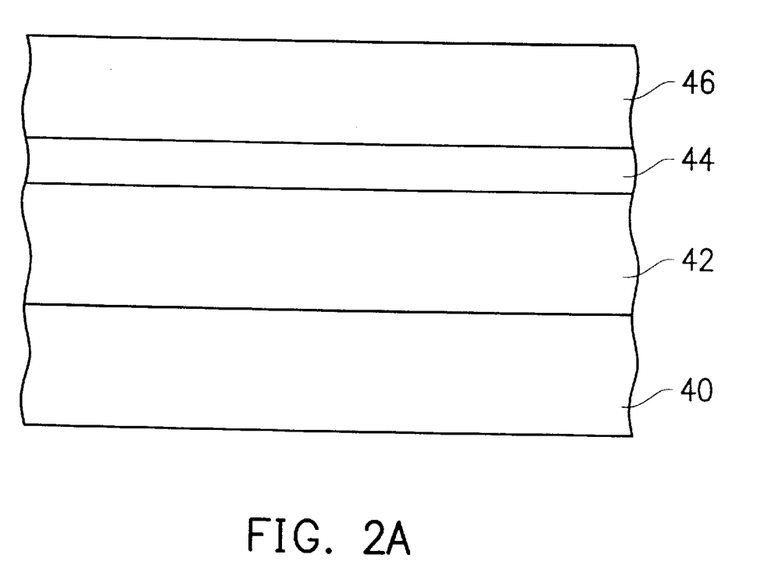
FIG. 2A through FIG. 2G are cross-sectional views illustrating the fabrication steps of a nested capacitor according to an embodiment of the invention.

The method of the invention will be described in accompaniment with the drawings. Referring to FIG. 2A, a first tetraethyl-orthosilicate (TEOS) layer 42, a conducting polysilicon layer 44 and a second TEOS layer 46 are successively formed over a semiconductor substrate 40 which is preferably a silicon substrate in the embodiment. The first TEOS layer 42, the polysilicon layer 44 and the second TEOS layer 46 can be formed by any conventional deposition method, such as the chemical-vapor deposition (CVD) method, to a thickness of about 2000–10000 Å, 200–2000 Å, and 1000–10000 Å, respectively.

Figure 2B:
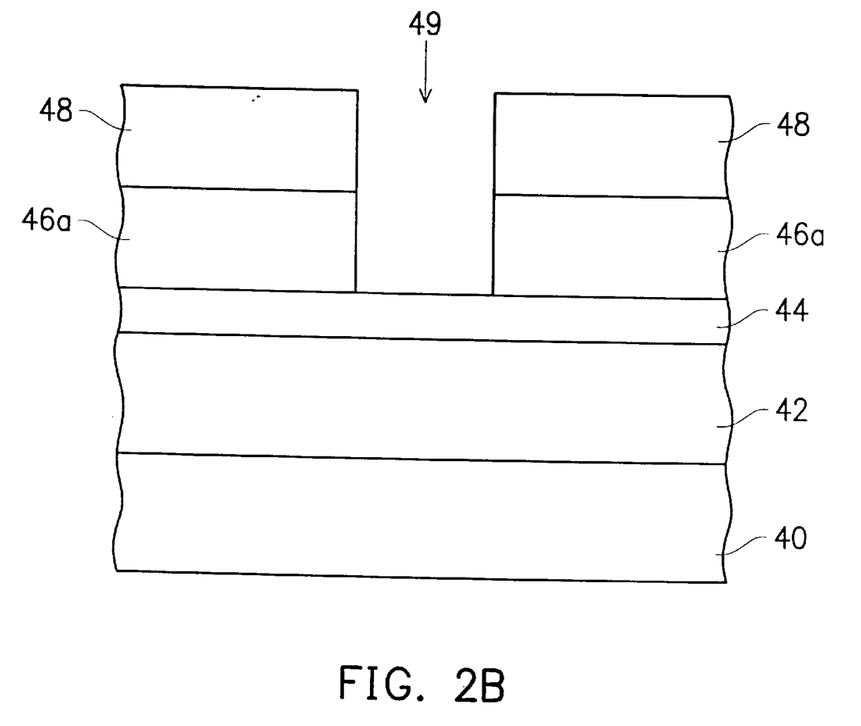

In order to define the region for fabricating a capacitor, a photoresist layer 48 is formed over the structure of FIG. 2A. Referring to FIG. 2B, the photoresist layer 48 is patterned to define a window 49 therein through which the exposed TEOS layer 46a is removed, thereby forming a trench therein. The size of the window can be as small as possible or as desired, depending upon the lithographic limitation of the fabrication technology used to make the DRAM device. A dry etch step can be carried out to remove the uncovered TEOS in the contact hole 49 due to the high etching selectivity between the TEOS layer 46 and the underlying polysilicon layer 44.

Figure 2C:
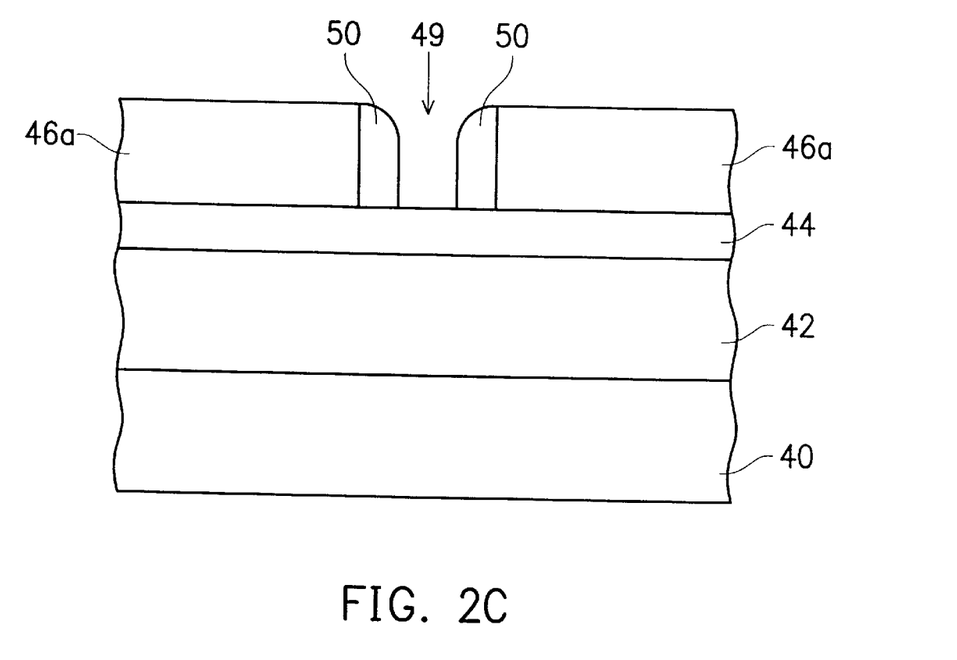

Thereafter the photoresist layer 48 is removed and a dielectric layer, such as a layer of silicon nitride ($Si_3N_4$), is deposited over the TEOS layer 46a. The dielectric layer is then etched back by a conventional dry etch to define a spacer 50 in the window 49, as shown in FIG. 2C. The spacer 50 preferably has a thickness of about 50–2000 Å, and, as such, it covers a portion of the underlying polysilicon layer 44. However, an exposed portion of the polysilicon layer 44 remains in the window 49 of the TEOS layer 46a between the spacer 50. The TEOS layer 46a and the dielectric spacer 50 are then utilized as masks as the polysilicon layer 44 is etched. The first TEOS layer 42 is a good etch stop layer for etching the polysilicon layer 44.

Figure 2D:
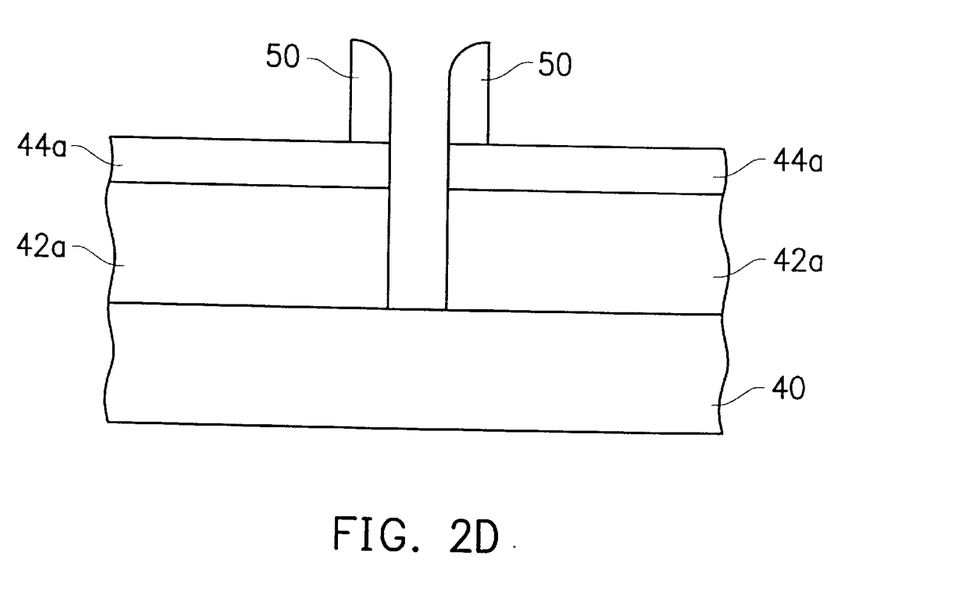

When the exposed portion of the polysilicon layer in the window 49 has been removed, another etch is performed to remove the TEOS layer 46a. The remaining TEOS layer 46a and the exposed portion of the first TEOS layer in the window 49 are thereby removed. Referring to FIG. 2D, the polysilicon layer 44a and the semiconductor substrate 40 are utilized as etch stops during the removal of the TEOS layer 46a and the exposed portion of the first TEOS layer in window 49, respectively, due to the high etching selectivity between the TEOS material and silicon. Therefore, the window defined by the dielectric spacer 50 pierces the polysilicon layer 44a and the TEOS layer 42a down to the surface of the substrate 40 and thereby defines a contact hole for substrate 40.

Figure 2E:
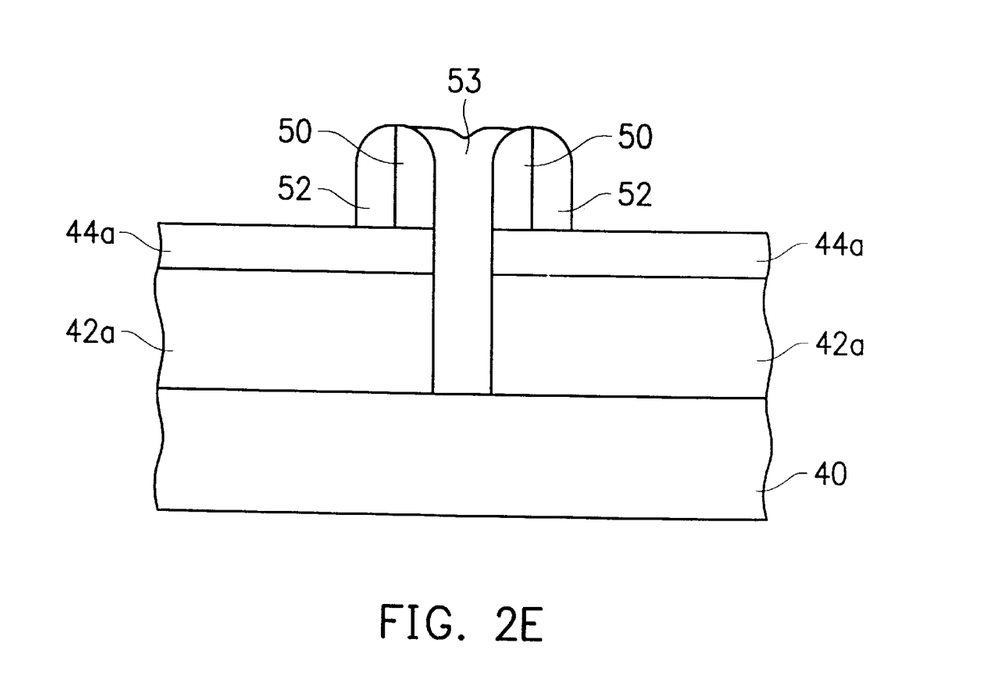

After the contact is completed, a polysilicon layer is deposited, by CVD method, over the structure of FIG. 2D, and fills in the contact hole. The polysilicon layer contains impurities therein. That is, it is preferably a doped polysilicon layer. The impurities are preferably introduced in the polysilicon layer during the deposition (i.e., in situ), or they can be implanted in a well-deposited polysilicon layer. The doped polysilicon layer is then etched back by a dry etch to define (i) a first polysilicon spacer 52 around the dielectric spacer 50 and (ii) a polysilicon plug 53 in the contact hole, as shown in FIG. 2E. The polysilicon spacer is preferably etched to a thickness of about 100–1000 Å. Since the contact hole is filled with the doped polysilicon plug 53, it is substantially connected to substrate 40 and to polysilicon layer 44a. Additionally, the polysilicon plug 53 is electrically coupled to the polysilicon spacer 52 via the polysilicon layer 44a.

Figure 2F:
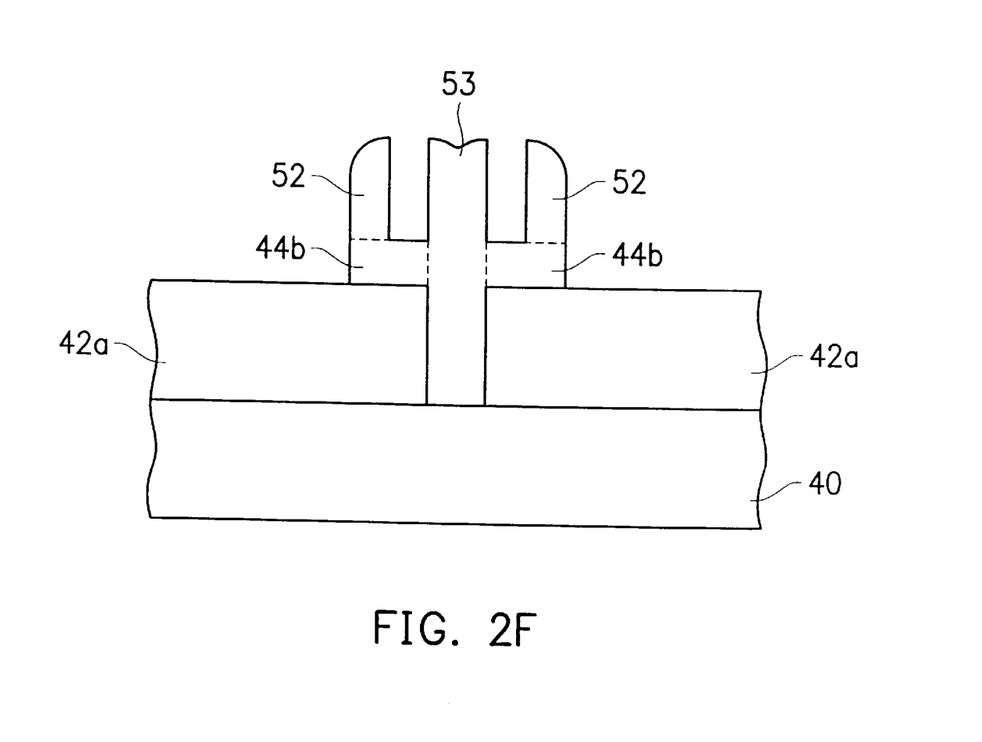
Figure 2G:
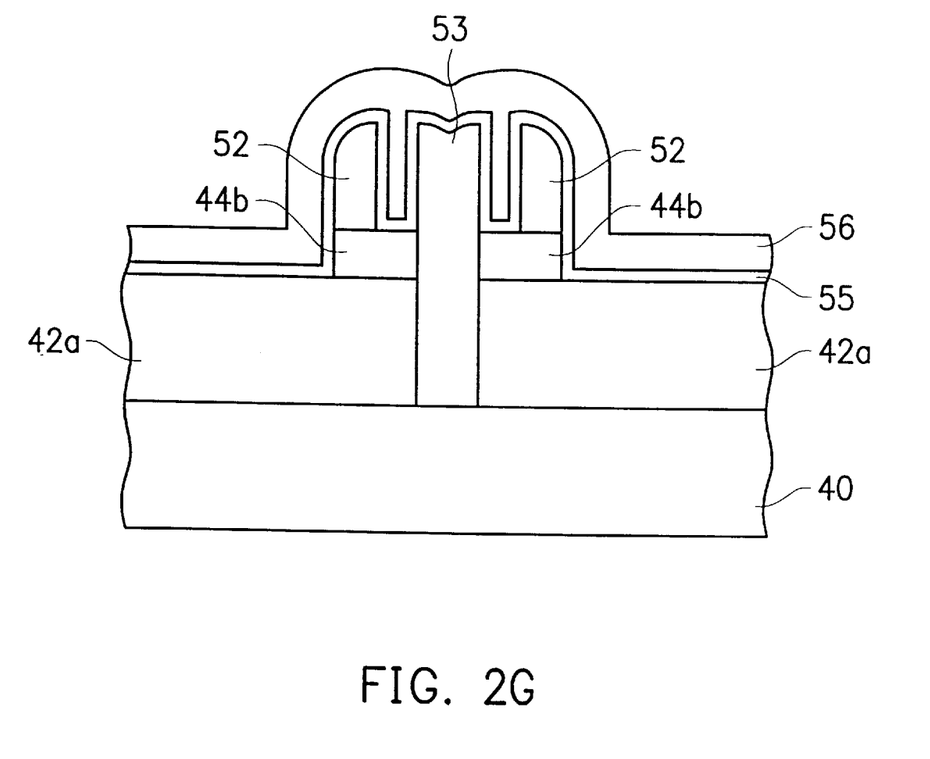

The dielectric spacer 50 is thereafter removed by etching and, the polysilicon layer 44a is patterned to define a lower electrode of the capacitor. The polysilicon spacer 52 surrounds the polysilicon plug 53 and thus it can be characterized as a surrounding member. Referring to FIG. 2F, the afore-described processing provides a lower electrode structure containing the polysilicon spacer 52, a portion of the polysilicon layer 44b and the polysilicon plug 53 which is formed over and in contact with the substrate 40. This electrode structure is supported by the polysilicon plug 53 which is also electrically connected to the substrate 40 through the contact hole in the first TEOS layer 42a. To complete the capacitor, a dielectric layer 55 and a upper electrode 56 are deposited by CVD methods over the lower electrode, as can be seen in FIG. 2G.

Figure 3A:
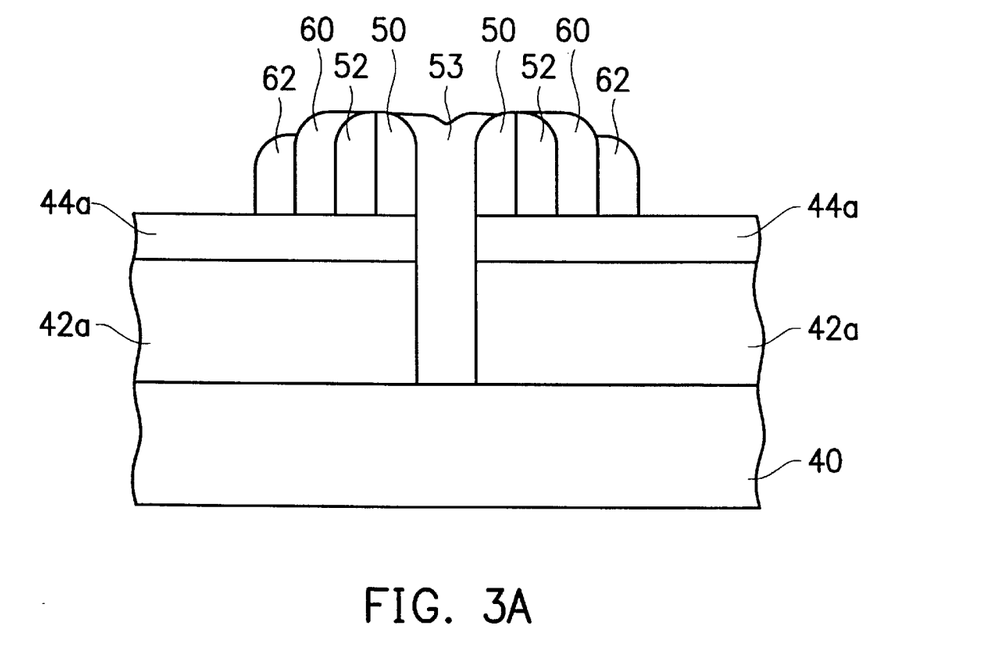
FIG. 3A through FIG. 3C are cross-sectional views illustrating the fabrication method according to another embodiment of the invention.
Figure 3B:
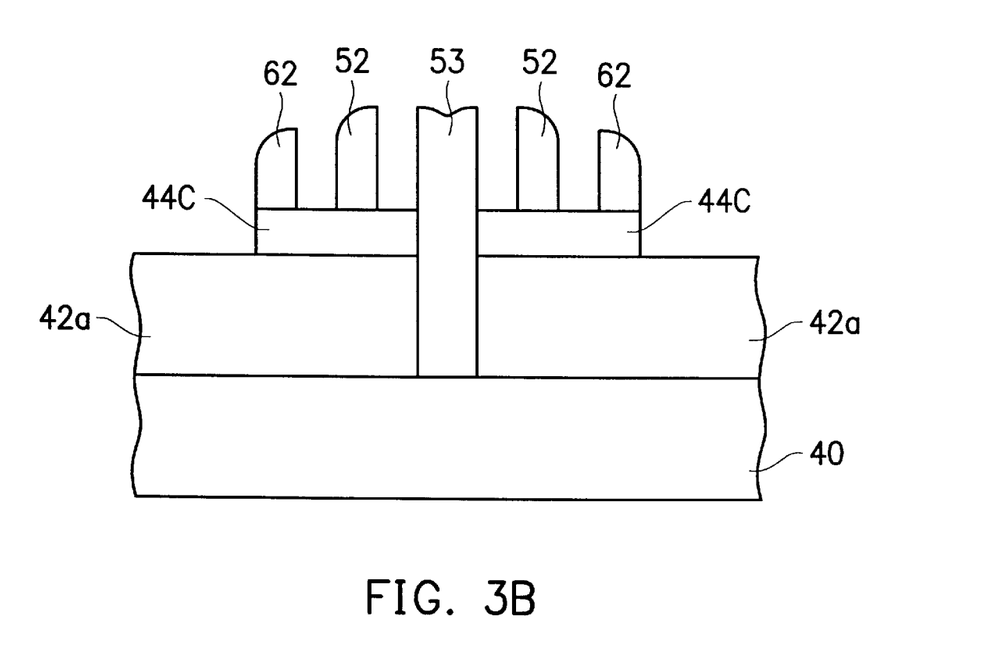
Figure 3C:
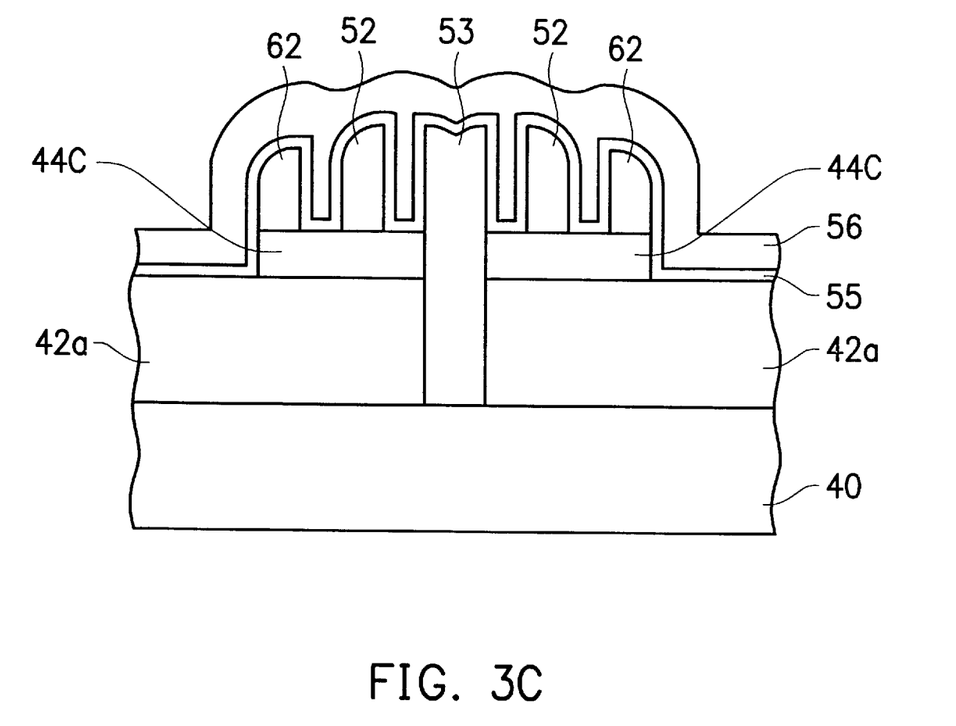

The structure and fabrication method of the nested capacitor of the invention is not limited to the aforementioned embodiment. For example, there more than one polysilicon spacer can be fabricated in the lower electrode. Referring to FIG. 3A, after the formation of the first polysilicon spacer 52 (see also FIG. 2E), another dielectric layer can be formed over the structure of FIG. 2E, and then etched back to form a second dielectric spacer 60 around the first polysilicon spacer 52. Similarly, a second polysilicon spacer 62 is formed around the second dielectric spacer 60 by depositing a polysilicon layer and dry etching the polysilicon layer. Thereafter, when the first dielectric spacer 50 and the second dielectric spacer 60 are both removed, and the polysilicon layer 44a is defined, a lower electrode having two polysilicon spacers is then deposited over the substrate 40, as shown in FIG. 3B. The lower electrode consists of the polysilicon plug 53, the polysilicon layer 44c, and the two polysilicon spacers 52 and 62. The final structure of the two-spacer nested capacitor is illustrated in FIG. 3C. Since the number of spacers is increased, the surface area of the lower electrode is further increased and therefore the performance of the capacitor is further improved.

According to the present invention, nested capacitors having more than two spacers can be fabricated by reproducing the dielectric and polysilicon spacers around the polysilicon plug 53. That is, a plurality of dielectric spacers and a plurality of polysilicon spacers can be formed according to the disclosure of the invention set forth above by repeating the procedure disclosed with reference to FIG. 3A. Therefore, the first dielectric spacer and the plurality of dielectric spacers are removed to define a lower electrode including the polysilicon plug, the polysilicon layer, the first polysilicon spacer and the plurality of additional polysilicon spacers.

In the invention, the dielectric layer formed over the lower electrode of the capacitor can be a thin ONO layer, a $Ta_2O_5$ layer, a PZT layer, a BST layer or other capacitor dielectric layer. The upper electrode of the capacitor can be formed by depositing a conducting polysilicon layer over the dielectric layer.

The nested capacitor fabricated in accordance with the method of the present invention, as described above, has a relatively large capacitance, yet occupies a relatively small surface area of the semiconductor substrate. That is, a highly-integrated capacitor structure is fabricated. Moreover, since the fabrication steps of the invention are consistent with conventional semiconductor processes and the invention does not suffer from severe process limitations.

What is claimed is:

1. A method for fabricating a capacitor on a semiconductor substrate, comprising the steps of:

forming a first TEOS layer over said semiconductor substrate;

forming a polysilicon layer over said first TEOS layer;

forming a second TEOS layer over said polysilicon layer;

removing a portion of said second TEOS layer to form a window therein, thereby exposing a portion of the polysilicon layer;

forming a first dielectric spacer in said window;

removing the exposed portion of the polysilicon layer in the window, thereby exposing a portion of the first TEOS layer;

removing said second TEOS layer and the portion of said first TEOS layer exposed in the window thereby forming a trench extending down to the semiconductor substrate;

depositing a polysilicon plug in the trench and forming a first polysilicon spacer around said first dielectric spacer;

removing said first dielectric spacer, thereby forming a lower electrode including said polysilicon plug, said polysilicon layer and said first polysilicon spacer;

forming a dielectric layer over said lower electrode; and forming an upper electrode over said dielectric layer.

2. The method as claimed in claim 1, wherein said first dielectric layer is formed by etching back a silicon nitride layer.

3. The method as claimed in claim 1, wherein said first polysilicon layer is doped with impurities when deposited over said first TEOS layer.

4. The method as claimed in claim 1, wherein said first polysilicon layer is doped with impurities after deposition over said first TEOS layer.

5. The method as claimed in claim 1, wherein said first dielectric spacer is formed by etching back a silicon nitride layer which is deposited in the window.

6. The method as claimed in claim 1, wherein said polysilicon plug and said first polysilicon spacer are formed by etching back a conducting polysilicon layer which covers said first dielectric spacer.

7. The method as claimed in claim 1, wherein said dielectric layer over said lower electrode is a thin ONO layer.

8. The method as claimed in claim 1, wherein said dielectric layer over said lower electrode is made of one selected from the group of $Ta_2O_5$, BST and PZT.

9. The method as claimed in claim 1, wherein said upper electrode is formed by depositing a conducting polysilicon layer.

10. The method as claimed in claim 1 wherein the step of removing said second TEOS layer and the portion of said first TEOS layer exposed in the window is performed in a single etching step.

11. A method for fabricating a capacitor on a semiconductor substrate, comprising the steps of:

forming a first TEOS layer over said semiconductor substrate;

forming a polysilicon layer over said first TEOS layer;

forming a second TEOS layer over said polysilicon layer;

removing a portion of said second TEOS layer to form a window therein, thereby exposing a portion of the polysilicon layer;

forming a first dielectric spacer in said window;

removing the exposed portion of the polysilicon layer in the window, thereby exposing a portion of said first TEOS layer;

removing said second TEOS layer and the exposed portion of said first TEOS layer, thereby forming a trench extending down to the semiconductor substrate;

depositing a polysilicon plug in the trench and forming a first polysilicon spacer around said first dielectric spacer;

forming a second dielectric spacer around said first polysilicon spacer;

forming a second polysilicon spacer around said second dielectric spacer;

removing the first dielectric spacer and the second dielectric spacer, thereby forming a lower electrode including said polysilicon plug, said polysilicon layer, said first polysilicon spacer and said second polysilicon spacer;

forming a dielectric layer over said lower electrode; and forming an upper electrode over said dielectric layer.

12. The method as claimed in claim 11, wherein said first dielectric layer is formed by etching back a silicon nitride layer.

13. The method as claimed in claim 11, wherein said first polysilicon layer is doped with impurities when deposited over said first TEOS layer.

14. The method as claimed in claim 11, wherein said first polysilicon layer is doped with impurities after deposition over said first TEOS layer.

15. The method as claimed in claim 11, wherein said first dielectric spacer is formed by etching back a silicon nitride layer which is deposited in the window.

16. The method as claimed in claim 11, wherein said polysilicon plug and said first polysilicon spacer are formed by etching back a conducting polysilicon layer which covers said first dielectric spacer.

17. The method as claimed in claim 11, wherein said upper electrode is formed by depositing a conducting polysilicon layer.

18. A method for fabricating a capacitor on a semiconductor substrate, comprising the steps of:

forming a first TEOS layer over said semiconductor substrate;

forming a polysilicon layer over said first TEOS layer;

forming a second TEOS layer over said polysilicon layer;

removing a portion of said second TEOS layer to form a window therein, thereby exposing a portion of the polysilicon layer;

forming a first dielectric spacer in said window;

removing the exposed portion of the polysilicon layer in the window, thereby exposing a portion of said first TEOS layer;

removing said second TEOS layer and the exposed portion of said first TEOS layer, thereby forming a trench extending down to the semiconductor substrate;

depositing a polysilicon plug in the trench and forming a first polysilicon spacer around said first dielectric spacer;

forming in alternating layers at least one further dielectric spacer and at least one further polysilicon spacer around said first polysilicon spacer;

removing the first dielectric spacer and each said further dielectric spacer, thereby forming a lower electrode including said polysilicon plug, said polysilicon layer, said first polysilicon spacer and each said further polysilicon spacer;

forming a dielectric layer over said lower electrode; and forming an upper electrode over said dielectric layer.

19. The method as claimed in claim 18, wherein said first dielectric layer is formed by etching back a silicon nitride layer.

20. The method as claimed in claim 18, wherein said polysilicon plug and said first polysilicon spacer are formed by etching back a conducting polysilicon layer which covers said first dielectric spacer.

21. The method as claimed in claim 18, wherein said upper electrode is formed by depositing a conducting polysilicon layer.

* * * * *